(12) United States Patent
Chapelon

(10) Patent No.: US 8,896,121 B2
(45) Date of Patent: Nov. 25, 2014

(54) CHIP ASSEMBLY SYSTEM

(71) Applicant: STMicroelectronics (Crolles 2) SAS, Crolles (FR)

(72) Inventor: Laurent-Luc Chapelon, Domene (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/765,760

(22) Filed: Feb. 13, 2013

(65) Prior Publication Data

US 2013/0207268 A1 Aug. 15, 2013

(30) Foreign Application Priority Data

Feb. 14, 2012 (FR) ...................... 12 51362

(51) Int. Cl.
*H01L 23/492* (2006.01)
*H01L 23/00* (2006.01)
*H01L 25/065* (2006.01)
*H01L 25/00* (2006.01)

(52) U.S. Cl.
CPC ............ *H01L 23/4924* (2013.01); *H01L 24/05* (2013.01); *H01L 2224/08145* (2013.01); *H01L 24/80* (2013.01); *H01L 2224/08121* (2013.01); *H01L 2224/05547* (2013.01); *H01L 2225/06513* (2013.01); *H01L 24/08* (2013.01); *H01L 25/0657* (2013.01); *H01L 2224/06517* (2013.01); *H01L 2224/80357* (2013.01); *H01L 2224/80097* (2013.01); *H01L 2224/05647* (2013.01); *H01L 2224/05657* (2013.01); *H01L 2224/08147* (2013.01); *H01L 25/50* (2013.01); *H01L 2224/05687* (2013.01); *H01L 24/06* (2013.01); *H01L 2224/05688* (2013.01)
USPC ........... 257/751; 257/664; 257/734; 257/752; 257/E29.111; 257/E23.01

(58) Field of Classification Search
USPC .................................. 257/664–665, 734–786, 257/E29.111–E29.165, E23.01–E23.079, 257/E23.141–E23.179
See application file for complete search history.

(56) References Cited

U.S. PATENT DOCUMENTS

| | | | |
|---|---|---|---|
| 6,596,640 B1 | 7/2003 | Fishcer et al. | |
| 2003/0015799 A1* | 1/2003 | Abiru et al. | 257/758 |
| 2006/0220197 A1 | 10/2006 | Kobrinsky et al. | |
| 2006/0234473 A1 | 10/2006 | Wong et al. | |
| 2007/0197023 A1 | 8/2007 | Widodo et al. | |
| 2008/0116584 A1 | 5/2008 | Sitaram | |
| 2011/0084403 A1 | 4/2011 | Yang et al. | |

FOREIGN PATENT DOCUMENTS

FR 2963158 A1 1/2012

* cited by examiner

*Primary Examiner* — Mamadou Diallo
(74) *Attorney, Agent, or Firm* — Allen, Dyer, Doppelt, Milbrath & Gilchrist, P.A.

(57) ABSTRACT

An assembly of semiconductor wafers/chips wherein the adjacent surfaces of the two wafers/chips comprise an insulating layer having opposite copper pads inserted therein. The insulating layer is made of a material selected from the group including silicon nitride and silicon carbon nitride.

6 Claims, 2 Drawing Sheets

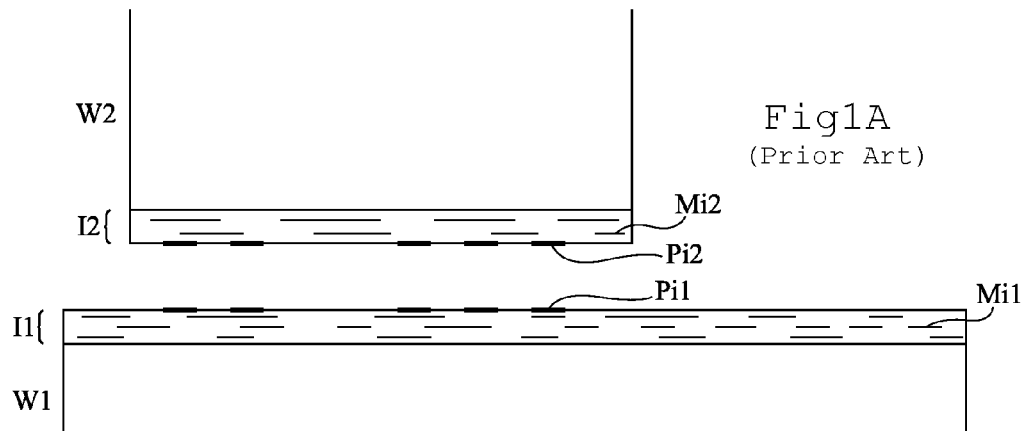
Fig 1A (Prior Art)
Fig 1B (Prior Art)
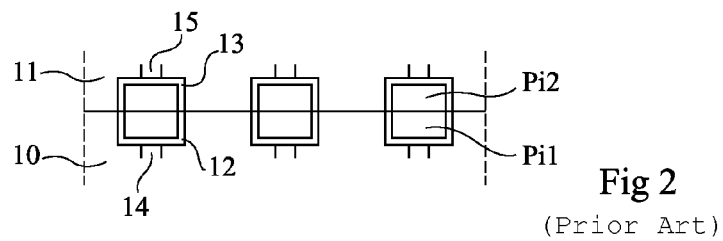
Fig 2 (Prior Art)
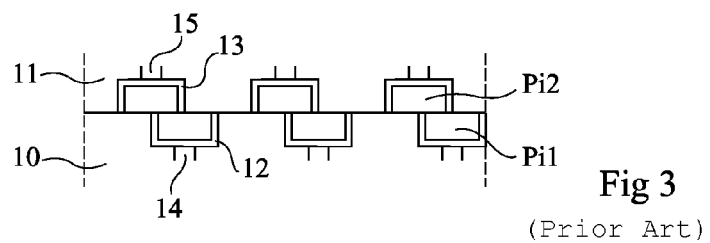
Fig 3 (Prior Art)

CHIP ASSEMBLY SYSTEM

CROSS REFERENCE TO RELATED APPLICATION

This application is a translation of and claims the priority benefit of French patent application number 12/51362, filed on Feb. 14, 2012, entitled "CHIP ASSEMBLY SYSTEM," which is hereby incorporated by reference to the maximum extent allowable by law.

BACKGROUND

The present disclosure relates to the field of three-dimensional integrated circuits. Indeed, to increase the integration level of semiconductor components, there is a tendency to form integrated circuits made of a stack of chips.

FIGS. 1A and 1B very schematically show a three-dimensional assembly of semiconductor components. A first semiconductor element (chip or wafer) W1 supports a second semiconductor element W2 (a wafer or one or several second semiconductor wafers). The opposite surfaces of each of semiconductor elements W1, W2 are coated with an interconnection structure, respectively I1, I2. Each of interconnection structures I1, I2 comprises a number of metallization levels, respectively Mi1, Mi2. Conventionally, these various interconnection levels are embedded in an insulator and are connected to one another by vias to create a contact between selected areas of each of the semiconductor elements with copper pads Pi1, Pi2 formed of the outermost layer of each of interconnection levels I1, I2.

Opposite pads Pi1 and Pi2 of each of semiconductor elements W1, W2 must then be interconnected. This connection between pads may be achieved in various ways. For example, connection between pads may be achieved by conductive pillars or bumps, each bump or pillar being welded to two opposite pads.

Another technique which has developed to form this interconnection between opposite pads comprises very carefully polishing the opposite surfaces of two semiconductor elements W1, W2 and directly applying the two opposite surfaces against each other. An anneal is then carried out, for example at temperatures approximately ranging from 300 to 400° C. As a result, with no addition of external material (bump, pillar, welding . . . ), a connection between opposite surfaces is obtained. The bonding between the copper surfaces of opposite pads Pi1 and Pi2 results from the anneal, while the opposite insulating surfaces bond to each other by molecular bonding.

FIG. 2 is an enlarged view only showing opposite pads Pi1 and Pi2. In a conventional technology, insulator 10, 11 where these pads are formed is silicon oxide ($SiO_2$) and pads Pi1 and Pi2 are made of copper. To form the copper pads, conventionally, cavities are opened in insulating layer 10, 11 of each of the opposite elements, the structure is coated with a layer forming a barrier against the diffusion of copper 12, 13, currently Ti, TiN, Ta, or TaN, or an association of these materials, as well as with a copper bonding layer (not shown) and an electrolytic copper deposition followed by a chem.-mech. polishing is performed to obtain a planar external surface, the barrier and bonding layers being removed from the surface.

FIG. 2 also shows that each of the pads is connected by a via 14, 15 to a lower metallization level, not shown. This technique of direct assembly by copper-to-copper and $SiO_2$-to-$SiO_2$ bonding has provided satisfactory results and is particularly reliable in terms of bonding and is simple to implement.

However, as illustrated in FIG. 3, this type of assembly has a disadvantage in the case where there is a misalignment between opposite pads Pi1 and Pi2 at the time of the assembly, which is difficult to avoid in practice. In this case, a portion of the copper of a pad Pi1, Pi2 is in contact with the insulating layer of the opposite element. A lack of reliability of the obtained components can then be observed during their lifetime. This lack of reliability is imputed to the fact that during the component operation, while the component is submitted to temperature rises, the pad copper may diffuse into the opposite silicon oxide and, from there, to the semiconductor surface of the opposite semiconductor elements, which alters the operation of the electronic components formed in these elements.

To solve this problem, FR2963158 and US2011/084403 propose to change the $SiO_2$ layer in which the copper pads are formed to a layer of a material in which copper does not diffuse. This solution necessitates an important change in the manufacturing steps of the wafers.

There thus is a need to improve procedures of assembly of semiconductor wafers while keeping the advantages of the previously-described simple and direct assembly.

SUMMARY OF THE INVENTION

To fulfill this need, an embodiment provides an assembly of semiconductor wafers/chips wherein the adjacent surfaces of two wafers/chips each comprise a silicon oxide layer having copper pads formed therein, wherein the silicon oxide layer is coated, outside of regions in which the copper pads are formed, with a silicon nitride or silicon carbon nitride layer thinner than the thickness of the copper pads.

According to an embodiment, the opposite surfaces of the copper pads are nitrided-silicided.

According to an embodiment, the opposite surfaces of the copper pads are coated with CoWP.

According to an embodiment, the pads are regularly distributed on each of the chips/wafers, at least some of the pads being electrically unconnected.

According to an embodiment, several first chips are associated with a same second chip.

According to an embodiment, the second chip belongs to a semiconductor wafer comprising an assembly of second chips.

The foregoing and other features and benefits will be discussed in detail in the following non-limiting description of specific embodiments in connection with the accompanying drawings.

BRIEF DESCRIPTION OF THE DRAWINGS

FIGS. 1A and 1B, previously-described, shows two opposite semiconductor elements;

FIG. 2, previously-described, shows the external portion of two opposite semiconductor elements;

FIG. 3, previously-described, shows the external portion of two opposite semiconductor elements;

For clarity, the same elements have been designated with the same reference numerals in the different drawings and, further, as usual in the representation of integrated circuits, the various drawings are not to scale.

DETAILED DESCRIPTION

Figure 4:
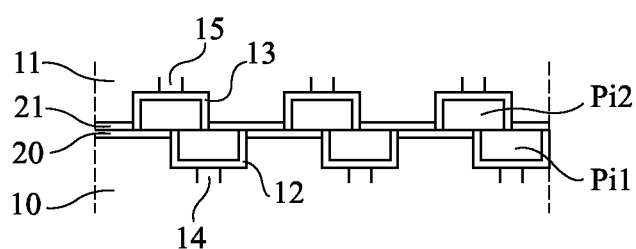
FIG. 4 shows another embodiment of the opposite external portions of two semiconductor elements.

FIG. 4 shows the external surfaces of an assembly according to the present invention. It shows the same pads Pi1, Pi2 as those described and shown in relation with FIGS. 2 and 3.

In this embodiment, the pads are now formed in a silicon oxide layer covered with an insulating layer 20, 21 of a material having, on the one hand, like silicon oxide, the advantage that the two opposite polished surfaces bond to each other by molecular bonding and, on the other hand, the advantage that copper is not capable of diffusing therein. A preferred example of such a material is silicon nitride ($Si_3N_4$) or SiCN.

Figure 5:
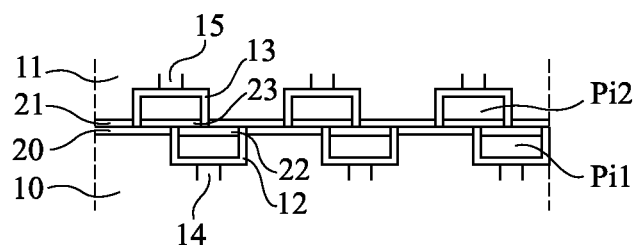
FIG. 5 shows another embodiment of the opposite external portions of two semiconductor elements.

FIG. 5 shows another variation of the assembly of FIG. 4. The same elements are designated with the same reference numerals in FIG. 4. In this embodiment, a thin barrier layer 22, 23 of a copper silicon nitride CuSiN self-positioned on the external surface of the copper pads is formed by successively or simultaneously performing a siliciding and a nitriding of the external surface of the copper. Copper silicon nitride layer 22, 23 is used as a barrier against the exodiffusion of copper. This helps improving the result already obtained by the provision of an SiN or SiCN insulating layer.

Other types of barrier layers may be used, for example, a CoWP layer.

As a dimensional example, it should be noted that each of the copper pads may have lateral dimensions ranging from 3 to 5 micrometers and a thickness ranging from 0.5 to 1 micrometer, the spacing between copper pads being of the same order of magnitude.

Further, FIGS. 4 and 5 show that each copper pad is connected to a via 14, 15 intended to connect it to elements of at least one of the lower metallization levels.

In practice, the connected copper pads will not necessarily be regularly arranged over the entire surface of the opposite elements. However, the present inventors have observed that a better bonding between the two assembled elements is obtained when the copper pads are regularly distributed. Thus, on each of the opposite surfaces of the two elements, regularly distributed copper pads will be provided, some of these pads being "dummy" pads, which are not connected to lower metal levels.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An assembly of semiconductor wafers/chips wherein the adjacent surfaces of two wafers/chips (W1, W2) each comprise a silicon oxide layer having copper pads formed therein, wherein the silicon oxide layer is coated, outside of regions in which the copper pads are formed, with a silicon nitride or silicon carbon nitride layer thinner than the thickness of the copper pads, and wherein an external surface of the silicon nitride or silicon carbon nitride layer is substantially planar with an external surface of the pads.

2. The assembly of semiconductor wafers/chips of claim 1, wherein the opposite surfaces of the copper pads (Pi1, Pi2) are nitrided-silicided.

3. The assembly of semiconductor wafers/chips of claim 1, wherein the opposite surfaces of the copper pads (Pi1, Pi2) are coated with CoWP.

4. The assembly of semiconductor chips/wafers of claim 1, wherein the pads are regularly distributed on each of the wafers/chips, at least some of the pads being electrically unconnected.

5. The assembly of claim 1, wherein several first chips are associated with a same second chip.

6. The assembly of claim 5, wherein the second chip belongs to a semiconductor wafer comprising an assembly of second chips.

* * * * *